US006867061B2

(12) United States Patent
Fischer et al.

(10) Patent No.: US 6,867,061 B2
(45) Date of Patent: Mar. 15, 2005

(54) METHOD FOR PRODUCING SURFACE MICROMECHANICAL STRUCTURES, AND SENSOR

(75) Inventors: Frank Fischer, Gomaringen (DE); Wilhelm Frey, Palo Alto, CA (US); Lars Metzger, Albstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/467,216

(22) PCT Filed: Feb. 4, 2002

(86) PCT No.: PCT/DE02/00397

§ 371 (c)(1),
(2), (4) Date: Dec. 16, 2003

(87) PCT Pub. No.: WO02/062698

PCT Pub. Date: Aug. 15, 2002

(65) Prior Publication Data

US 2004/0089903 A1 May 13, 2004

(30) Foreign Application Priority Data

Feb. 6, 2001 (DE) .......................................... 101 05 187

(51) Int. Cl.[7] .......................... H01L 21/00; H01L 27/20; H01L 29/82; H01L 29/84
(52) U.S. Cl. ........................... 438/52; 438/53; 257/254; 257/417
(58) Field of Search ...................... 438/52, 53; 257/254, 257/417

(56) References Cited

U.S. PATENT DOCUMENTS 5,756,901 A 5/1998 Kurle et al.

FOREIGN PATENT DOCUMENTS

| DE | 44 20 962 | 12/1995 | | |
|----|-----------|---------|---|---|
| DE | 42 41 045 | 3/1996 | | |
| DE | 195 37 814 | 5/1998 | | |
| DE | 198 47 455 | 4/2000 | | |
| GB | 2290413 A | * 12/1995 | ......... | H01L/21/306 |
| JP | 06 163872 | 6/1994 | | |
| WO | WO 94 18697 | 8/1994 | | |
| WO | WO 96 08036 | 3/1996 | | |

* cited by examiner

*Primary Examiner*—Erik Kielin
(74) *Attorney, Agent, or Firm*—Kenyon & Kenyon

(57) ABSTRACT

A method is described for producing surface micromechanical structures having a high aspect ratio, a sacrificial layer being provided between a substrate and a function layer, trenches being provided by a plasma etching process in the function layer, at least some of these trenches exposing surface regions of the sacrificial layer. To increase the aspect ratio of the trenches, an additional layer is deposited on the side walls of the trenches in at least some sections, but not on the exposed surface regions of the sacrificial layer. In addition, a sensor is described, in particular an acceleration sensor or a rotational rate sensor.

18 Claims, 2 Drawing Sheets

METHOD FOR PRODUCING SURFACE MICROMECHANICAL STRUCTURES, AND SENSOR

FIELD OF THE INVENTION

The present invention relates to a method of producing surface micromechanical structures having a high aspect ratio, at least one sacrificial layer being provided between a substrate and a function layer, trenches being provided in the function layer by a plasma etching operation, surface areas of the sacrificial layer being exposed by at least a few of these trenches. In addition, the present invention relates to a sensor, in particular an acceleration sensor or a rotational rate sensor, having micromechanical structures which include electrodes separated by trenches.

BACKGROUND INFORMATION

The present invention is directed to a generic method and a generic sensor as described in German Published Patent Application No. 195 37 814, the content of which is made part of the disclosure content of the present patent application through this reference. In general, deep etching methods are used in surface micromechanics, making it possible to manufacture component structures having a relatively high aspect ratio. The aspect ratio is understood to be the ratio of the depth of a trench, i.e., a recess, to its lateral dimension. A known deep structuring method in the form of a plasma etching method is described in German Patent No. 42 41 045, for example, the content of which is also made part of the disclosure content of the present patent application through this reference. With the trench method described in German Patent No. 42 41 045, trenches having a minimum trench width of 1 $\mu$m may be opened. As with all plasma etching methods, the etching rate depends on the structure spacings. In the case of narrow etching openings, the etching rate drops significantly in comparison with the etching rate achievable with wide etching openings. Only at spacings greater than approximately 10 $\mu$m is the etching rate essentially independent of the structure spacings. In summary, with the methods known in the past, spacings of less than 1 $\mu$m could not be manufactured reproducibly, i.e., reliably from the standpoint of manufacturing technology. For example, large electrode spacings have a negative effect on the electric sensitivity of the sensor in the case of sensors having micromechanical structures, including electrodes separated by trenches.

SUMMARY OF THE INVENTION

Due to the fact that to increase the aspect ratio with the method according to the present invention, an additional layer is deposited on the side walls of the trenches in at least some sections but not on the exposed surface areas of the sacrificial layer, it is possible to achieve smaller trench widths, i.e., structure spacings, than with the known methods. This makes it possible, for example, to increase the electric sensitivity of sensors. In many cases, the additional layer may be deposited by an inexpensive batch operation, which does not require complex precleaning or any additional mask level. In general, the surface micromechanical structures may be formed by method steps which are well known from semiconductor technology and therefore need not be explained further here.

In the preferred embodiment of the method according to the present invention, the additional layer is made of germanium, and the function layer is Si, while the sacrificial layer is $SiO_2$.

In this case in particular in the method according to the present invention, the additional layer is deposited by an LPCVD method (low-pressure chemical vapor deposition). In conjunction with the LPCVD method of depositing Ge, it is known that Ge will undergo nucleation only on Si but not on $SiO_2$. As a result, Ge is deposited at least on the side walls of the trenches, but no Ge is deposited on the exposed surface areas of the sacrificial layer. This makes it possible to bring an etchant to sacrificial layer 2 in order to etch it in subsequent method steps.

In conjunction with the method according to the present invention, the additional layer is preferably deposited at temperatures in the range of 350° C. to 500° C. This temperature range is highly suitable for LPCVD of Ge, for example.

In addition, in the method according to the present invention, the additional layer of $GeH_4$ is deposited to obtain the desired Ge layer.

In the method according to the present invention, the layer thickness of the additional layer is preferably in the range of 0.05 $\mu$m to 2 $\mu$m. In conjunction with sensors, for example, the electrode spacing may be adjusted effectively through the layer thickness of the additional layer.

After deposition of the additional layer according to the present invention, the trenches preferably have a width of less than 1 $\mu$m in at least some sections, and in embodiments which are preferred in particular, this width may be in the range between 0.1 $\mu$m and 1 $\mu$m.

In certain embodiments of the method according to the present invention, it is possible for a mask layer, which is provided on the function layer in some sections in conjunction with the plasma etching method, to be removed before deposition of the additional layer. In this case, the additional layer may also be deposited on the surface regions of the function layer previously covered by the mask layer.

In contrast, in other embodiments of the method according to the present invention, it is also possible for a mask layer which is provided in some sections on the function layer in conjunction with the plasma etching method not to be removed before deposition of the additional layer. In this case, it is possible to provide the additional layer only on the side walls of trenches formed in the traditional manner, in which case the mask layer which still covers the function layer may be removed subsequently.

In particular when the method according to the present invention is used to manufacture a sensor, it is also possible for a conductive layer to be provided between the sacrificial layer and the substrate and to be insulated by the sacrificial layer with respect to the function layer in some sections, as is known from the aforementioned German Published Patent Application No.195 37 814, for example.

Due to the fact that with the sensor according to the present invention, the trenches have a width of less than 1 $\mu$m in at least some sections, the electric sensitivity, for example, of a corresponding sensor may be improved significantly in comparison with the related art.

In this connection, the trenches have a width in the range of 0.1 $\mu$m to 1 $\mu$m in at least some sections, depending on the application.

In the preferred embodiment of the sensor according to the present invention, the side walls of the trenches are formed by a layer of Ge in at least some sections, this layer being produced by the method according to the present invention, for example.

In this connection, with the sensor according to the present invention, the layer of Ge forming the side walls of the trenches is preferably also deposited on a layer of Si. In this case, the Ge layer may be produced by an LPCVD method in an advantageous manner.

In the sensor according to the present invention, the electrodes are preferably also connected to a substrate or the conductive layer, e.g., by an Si substrate. The connection may be formed by sections of a sacrificial layer that are left behind, with a conductive layer being optionally provided between the sacrificial layer and the substrate in at least some sections.

In conjunction with the sensor according to the present invention, preferably at least a few of the electrodes attached to the substrate are mobile in at least some sections, as is shown and described in the aforementioned German Published Patent Application No. 195 37 814, for example.

DETAILED DESCRIPTION

Figure 1:
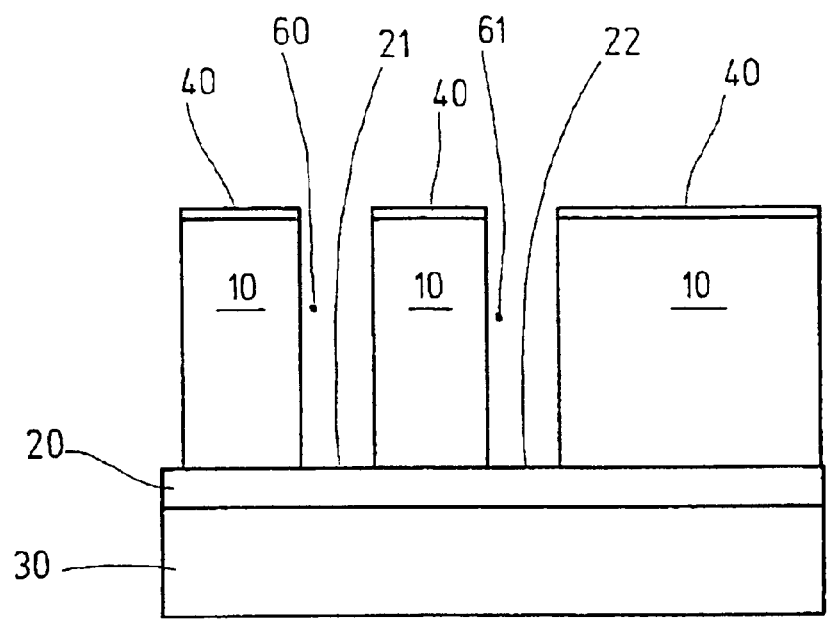
FIG. 1 shows a schematic diagram of a surface microstructure which may be produced by a generic method.

FIG. 1 shows a schematic diagram of a surface microstructure such as that which may be obtained by known methods, e.g., according to the teaching of the above-mentioned German Published Patent Application No. 195 37 814, where a substrate 30 may be formed by Si, for example. Because of the matching thermal expansion, Si is suitable in particular as a substrate material, because this eliminates thermal stresses, which could influence the characteristic curve of a sensor, for example. A sacrificial layer 20, which may be formed from $SiO_2$, for example, is provided on substrate 30. The deposition methods known from semiconductor technology for deposition of dielectric layers may be used for deposition of the $SiO_2$ layer. A function layer 10, preferably a sacrificial Si layer 20, is provided on sacrificial $SiO_2$ layer 20. In the diagram according to FIG. 1, Si function layer 10 has already been structured, namely by trenches 60, 61, which subdivide Si function layer 10 into individual sections, i.e., structures. Trenches 60, 61 are formed by a plasma etching method, a mask layer 40 being applied to Si function layer 10 before performing the actual etching operation, as is known from semiconductor technology. After performing the plasma etching method, trenches 60, 61 expose surface regions 21, 22 of sacrificial $SiO_2$ layer 20. The width of the trenches due to the plasma etching method is at least 1 $\mu$m, as already explained above.

Figure 2:
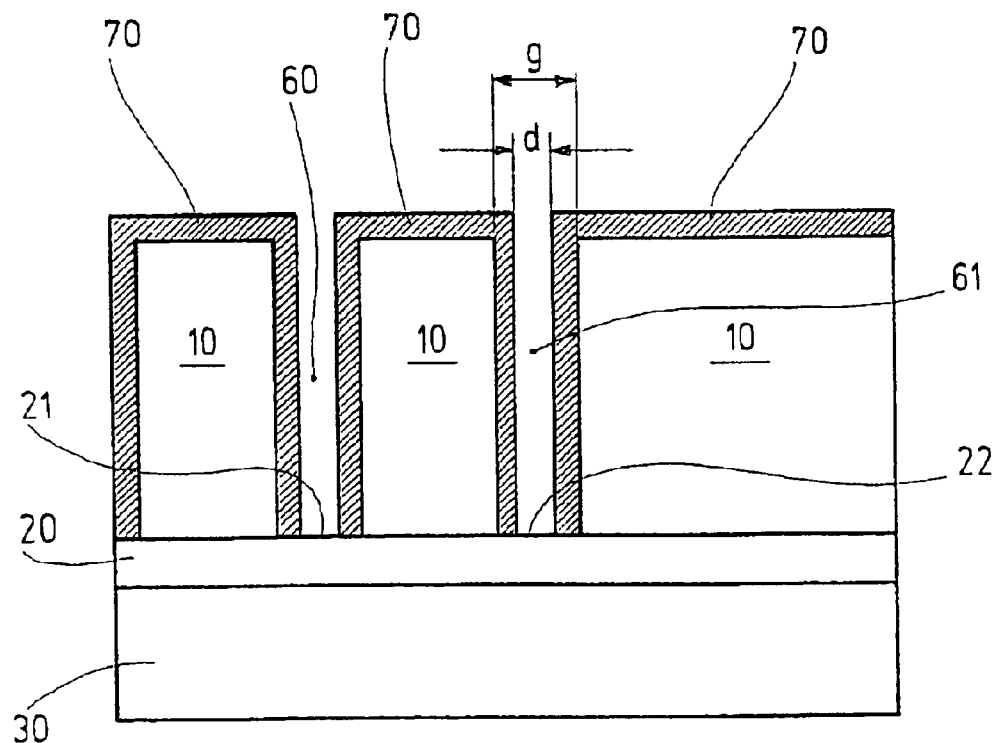
FIG. 2 shows the surface microstructure according to FIG. 1 after performing a first embodiment of the method according to the present invention.

FIG. 2 shows the surface microstructure according to FIG. 1 after performing a first embodiment of the method according to the present invention. Starting from the surface structure as illustrated in FIG. 1, the surface microstructure according to FIG. 2 is obtained by first removing mask layer 4 from Si function layer 10 by a suitable method. Then an additional layer 70 in the form of a Ge layer is deposited from $GeH_4$ by an LPCVD method, for example. This may be performed at temperatures between 350° C. and 500° C. Since, as mentioned above, Ge undergoes nucleation only on Si and not on $SiO_2$, no Ge is deposited on exposed surface areas 21, 22 of sacrificial $SiO_2$ layer 20, thus yielding the surface microstructure shown in FIG. 2. Ge layer 70 having a layer thickness in the range of 0.05 $\mu$m to 2 $\mu$m is deposited. Width d of trenches 60, 61, which may correspond to the electrode spacing in the case of a sensor, for example, may be adjusted as desired through the layer thickness of Ge layer 70, i.e., it may be reduced with respect to original width g of trenches 60, 61 produced by the plasma etching method.

Figure 3:
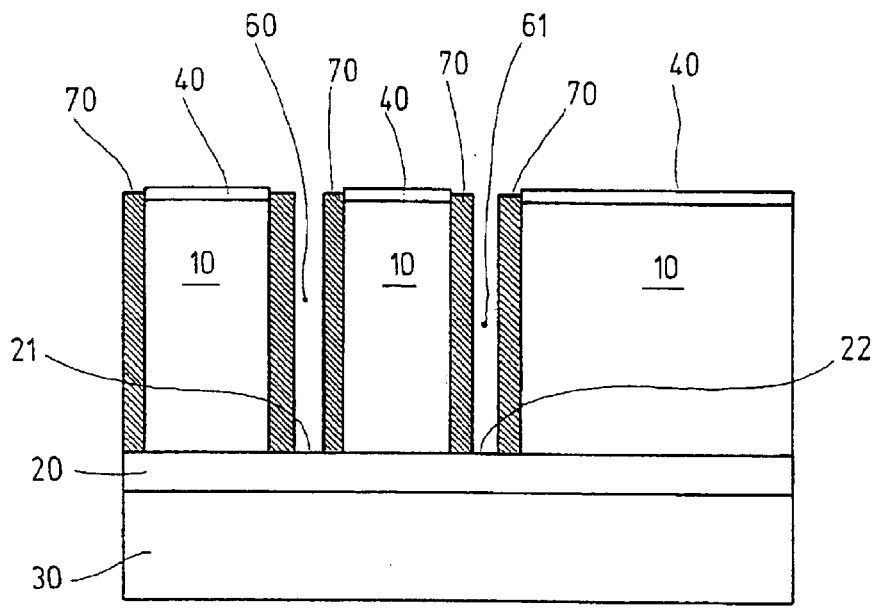
FIG. 3 shows the surface microstructure of FIG. 1 after performing a second embodiment of the method according to the present invention.

FIG. 3 shows the surface microstructure from FIG. 1 after performing a second embodiment of the method according to the present invention. The embodiment according to FIG. 3 differs from that according to FIG. 2 in that mask layer 40 is not removed before depositing the Ge layer. Therefore, Ge layer 70 is deposited only on the side walls of trenches 60, 61. As mentioned above, Ge will not undergo nucleation on $SiO_2$, so no Ge is deposited on exposed surface areas 21, 22 of sacrificial $SiO_2$ layer 20 in this case.

Figure 4:
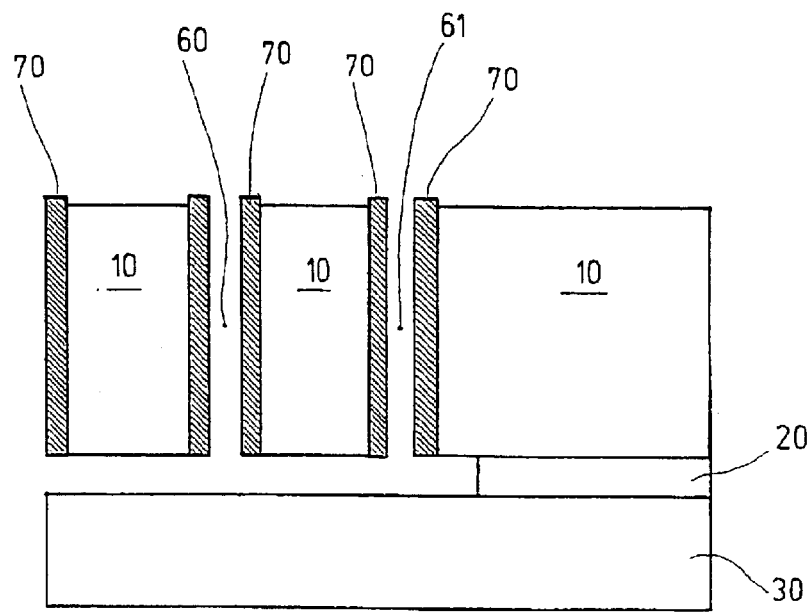
FIG. 4 shows the surface microstructure of FIG. 3 after performing additional method steps.

FIG. 4 shows the surface microstructure from FIG. 3 after performing additional method steps. Based on the diagram according to FIG. 3, mask layer 40 has been removed here and sacrificial $SiO_2$ layer 20 has been etched so that function layer 10 together with Ge layer 70 forms freely mobile structures which are situated closely spaced. When the structures formed by Si function layer 10 and Ge layer 70 form electrodes of a sensor, for example, the configuration thereof at a close spacing may result in an increased electric sensitivity of the sensor. Although this is not shown in the figure, a conductive layer may be formed between sacrificial $SiO_2$ layer 20 and Si substrate 30 and insulated by sacrificial $SiO_2$ layer 20 in some sections with respect to function layer 10, as shown in a similar manner in German Patent Application 195 37 814 A1 cited above. With regard to a possible embodiment of a sensor, reference is also made to the corresponding discussion in that publication.

Electrode spacings, for example, and the distance between components that function mechanically, e.g., stop limits, may be adjusted through the present invention so that closer spacings, i.e., distances are obtained than was possible in the past. In particular when additional layer 70 is produced by an LPCVD process, this may be implemented by a batch operation which causes only a low cost and does not require complex precleaning or an additional mask level. In addition, with certain embodiments, it may be desirable for the additional layer to be deposited only in certain sections of the side walls of trenches 60, 61. If additional layer 70 is formed by a Ge layer deposited by an LPCVD process, certain regions of the side walls of trenches 60, 61 where no other layer 70 is to be deposited may be covered with an oxide to this end.

The preceding description of the exemplary embodiments according to the present invention is presented only for illustrative purposes and not for the purpose of restricting the present invention. Various changes and modifications are possible within the scope of the present invention without going beyond the scope of the present invention or its equivalents.

What is claimed is:

1. A method of producing a surface micromechanical structure having a high aspect ratio, comprising:

providing at least one sacrificial layer between a substrate and a function layer;

providing trenches by a plasma etching process in the function layer, at least some of these trenches exposing surface regions of the at least one sacrificial layer; and depositing an additional layer on side walls of the trenches in at least some sections, but not on the exposed surface regions of the at least one sacrificial layer, to increase the aspect ratio of the trenches, wherein:

the additional layer includes Ge.

2. The method as recited in claim 1, wherein:

the function layer includes Si.

3. The method as recited in claim 1, wherein:

the at least one sacrificial layer includes SiO2.

4. The method as recited in claim 1, wherein:

the additional layer is deposited by an LPCVD process.

5. The method as recited in claim 1, wherein:

the additional layer is deposited at a temperature in a range of 350° C. to 500° C.

6. The method as recited in claim 1, wherein:

the additional layer is deposited from GeH4.

7. The method as recited in claim 1, wherein:

a layer thickness of the additional layer is in a range of 0.05 $\mu$m to 2 $\mu$m.

8. The method as recited in claim 1, wherein:

the trenches have a width of less than 1 $\mu$m in at least some sections after deposition of the additional layer.

9. The method as recited in claim 1, wherein:

the trenches have a width in a range of 0.1 $\mu$m to 1 $\mu$m, in at least some sections after deposition of the additional layer.

10. The method as recited in claim 1, further comprising:

providing a mask layer in some sections of the function layer in conjunction with the plasma etching process; and removing the mask layer before deposition of the additional layer.

11. The method as recited in claim 1, further comprising:

providing a mask layer in some sections of the function layer in conjunction with the plasma etching process, wherein:

the mask layer is not removed before deposition of the additional layer.

12. The method as recited in claim 1, further comprising:

providing a conductive layer between the at least one sacrificial layer and the substrate, the conductive layer being insulated by the at least one sacrificial layer with respect to the function layer in some sections.

13. A sensor, comprising:

micromechanical structures having electrodes separated by trenches, the trenches having a width of less than 1 $\mu$m in at least some sections, and side walls of the trenches being formed by a layer of Ge.

14. The sensor as recited in claim 13, wherein:

the sensor corresponds to one of an acceleration sensor and a rotational rate sensor.

15. The sensor as recited in claim 13, wherein:

the trenches have a width in a range of 0.1 m to 1 m, at least in some sections.

16. The sensor as recited in claim 13, wherein:

the layer of Ge forming the side walls of the trenches is deposited on a layer of Si.

17. The sensor as recited in claim 13, wherein:

the electrodes are connected to one of a substrate and a conducting layer.

18. The sensor as recited in claim 13, wherein:

the electrodes are connected to a substrate, and at least some of the electrodes connected to the substrate are mobile in at least some sections.

* * * * *